(12) United States Patent
Ohashi et al.

(10) Patent No.: US 11,758,343 B2
(45) Date of Patent: Sep. 12, 2023

(54) AUDIO MIXER AND METHOD OF PROCESSING SOUND SIGNAL

(71) Applicant: YAMAHA CORPORATION, Hamamatsu (JP)

(72) Inventors: Noriyuki Ohashi, Hamamatsu (JP); Shunichi Kamiya, Hamamatsu (JP); Arata Imai, Hamamatsu (JP)

(73) Assignee: YAMAHA CORPORATION, Hamamatsu (JP)

( * ) Notice: Subject to any disclaimer, the term of this patent is extended or adjusted under 35 U.S.C. 154(b) by 0 days.

(21) Appl. No.: 17/695,097

(22) Filed: Mar. 15, 2022

(65) Prior Publication Data

US 2022/0312139 A1 Sep. 29, 2022

(30) Foreign Application Priority Data

Mar. 29, 2021 (JP) ................ 2021-055969

(51) Int. Cl.
*H04S 1/00* (2006.01)
*H03G 5/00* (2006.01)
*H04S 7/00* (2006.01)
*H03G 5/16* (2006.01)

(52) U.S. Cl.
CPC ............ *H04S 1/007* (2013.01); *H03G 5/005* (2013.01); *H03G 5/165* (2013.01); *H04S 1/005* (2013.01); *H04S 7/301* (2013.01); *H04S 2420/01* (2013.01)

(58) Field of Classification Search
None
See application file for complete search history.

(56) References Cited

U.S. PATENT DOCUMENTS

2011/0211702 A1* 9/2011 Mundt ............... H04S 7/30
381/17

FOREIGN PATENT DOCUMENTS

JP 2009188450 A 8/2009

OTHER PUBLICATIONS

Best. "Sound Externalization: A Review of Recent Research." Trends in Hearing. 2020: 1-14. vol. 24.

* cited by examiner

*Primary Examiner* — Kenny H Truong
(74) *Attorney, Agent, or Firm* — ROSSI, KIMMS & McDOWELL LLP (57) ABSTRACT

An audio mixer includes a user interface, panners, a first adder, a localization device, a second adder, and an output circuit. The user interface supplies a first parameter and a second parameter for each channel based on a user operation. The first parameter indicates a position in a right-left direction. The second parameter specifies internalization or externalization. The panners respectively correspond to channels and, based on the first parameter, pan a sound signal corresponding to the each channel to generate first stereo signals. The first adder generates a second stereo signal by mixing first stereo signals respectively corresponding to externalization channels. The localization device generates two third stereo signals. The second adder generates a fourth stereo signal by mixing the two third stereo signals and first stereo signals respectively corresponding to internalization channels. The output circuit outputs the fourth stereo signal.

11 Claims, 6 Drawing Sheets

AUDIO MIXER AND METHOD OF PROCESSING SOUND SIGNAL

CROSS-REFERENCE TO RELATED APPLICATIONS

The present application claims priority under 35 U.S.C. § 119 to Japanese Patent Application No. 2021-055969, filed Mar. 29, 2021. The contents of this application are incorporated herein by reference in their entirety.

BACKGROUND

Field

The present disclosure relates to an audio mixer and a method of processing a sound signal.

Background Art

Conventionally, while musical players perform on a stage, each musical player uses an earphone or a headphone to monitor a mixture sound of a plurality of acoustic (sound) signals. In content production, a producer may perform an internalization (in-head localization) and an externalization (out-of-head localization) with respect to each sound signal for the sake of a viewer who uses a headphone (see JP2009-188450A) (each of these localizations will be hereinafter occasionally referred to as three-dimensional localization).

Conventionally, externalization has rarely been used in monitoring applications for stage performance. An externalization is performed using a transfer function generally referred to as a head-related transfer function, which is a function representing a characteristic determined by the shape of a human's head. In a typical externalization, a plurality of acoustic signals are input to a plurality of corresponding input channels, and divided into a plurality of groups. The signals in each group are mixed together into a mixed signal. Then, the mixed signal in each group is localized at a desired position in a three-dimensional space using a head-related transfer function. This processing, however, involves many parameters to be set. If this processing is used as it is for monitoring purposes on a stage, the operator of the mixer may find it difficult to grasp where the acoustic signal of each channel is localized. In addition, how to operate the audio mixer varies greatly depending on whether an externalization is performed or not. This has made it difficult for the operator to handle the audio mixer.

The present disclosure has been made in view of the above-described and other problems, and has an object to provide an audio mixer and a method of processing a sound signal such that the audio mixer and the method enable an operator of a mixer to easily specify, for each of a plurality of channels, a localization position in a three-dimensional space.

SUMMARY

One aspect is an audio mixer that includes a user interface, a plurality of panners, a first adder, a localization device, a second adder, and an output circuit. The user interface is configured to receive a user operation and supply a first parameter and a second parameter for each channel of a plurality of channels included in the audio mixer based on the received user operation. The first parameter indicates a position in a right-left direction. The second parameter specifies either an internalization or an externalization. The plurality of panners respectively correspond to the plurality of channels and are configured to, based on the first parameter for the each channel of the plurality of channels, pan a sound signal corresponding to the each channel of the plurality of channels so as to generate a plurality of first stereo signals respectively corresponding to the plurality of channels. The first adder is configured to generate a second stereo signal by mixing one or more first stereo signals among the plurality of first stereo signals that respectively correspond to one or more externalization channels among the plurality of channels. The one or more externalization channels are channels in which the second parameter specifies the externalization. The localization device is configured to generate two third stereo signals by performing three-dimensional localization on the second stereo signal. The second adder is configured to generate a fourth stereo signal by mixing the two third stereo signals and one or more first stereo signals among the plurality of first stereo signals that respectively correspond to one or more internalization channels among the plurality of channels. The one or more internalization channels are channels in which the second parameter specifies the internalization. The output circuit is configured to output the fourth stereo signal.

Another aspect is an audio mixer that includes a user interface, a plurality of panners, a first adder, a localization device, a second adder, and an output circuit. The user interface is configured to receive a user operation and supply a first parameter and a second parameter for each channel of a plurality of channels included in the audio mixer based on the received user operation. The first parameter indicates a position in a right-left direction. The second parameter specifies a balance of an internalization level and an externalization level. The plurality of panners respectively correspond to the plurality of channels and are configured to, based on the first parameter for the each channel of the plurality of channels, pan a sound signal corresponding to the each channel of the plurality of channels so as to generate a plurality of first stereo signals respectively corresponding to the plurality of channels. The first adder is configured to generate a second stereo signal by weighting the plurality of first stereo signals according to the externalization level specified by the second parameter and mixing the weighted first stereo signals. The localization device is configured to generate two third stereo signals by performing three-dimensional localization on the second stereo signal. The second adder is configured to generate a fourth stereo signal by weighting the plurality of first stereo signals according to the internalization level specified by the second parameter and mixing the two third stereo signals and the weighted first stereo signals. The output circuit is configured to output the fourth stereo signal.

Another aspect is a method of processing a sound signal. The method includes receiving a user operation and supplying a first parameter and a second parameter for each channel of a plurality of channels included in an audio mixer based on the received user operation. The first parameter indicates a position in a right-left direction. The second parameter specifies either an internalization or an externalization. The method also includes panning, based on the first parameter for the each channel of the plurality of channels, a sound signal corresponding to the each channel of the plurality of channels so as to generate a plurality of first stereo signals respectively corresponding to the plurality of channels. The method also includes generating a second stereo signal by mixing one or more first stereo signals among the plurality of first stereo signals that respectively correspond to one or more externalization channels among the plurality of channels. The one or more externalization channels are channels in which the second parameter specifies the externalization. The method also includes generating two third stereo signals by performing three-dimensional localization on the second stereo signal. The method also includes generating a fourth stereo signal by mixing the two third stereo signals and one or more first stereo signals among the plurality of first stereo signals that respectively correspond to one or more internalization channels among the plurality of channels. The one or more internalization channels are channels in which the second parameter specifies the internalization. The method also includes outputting the fourth stereo signal.

BRIEF DESCRIPTION OF THE DRAWINGS

A more complete appreciation of the present disclosure and many of the attendant advantages thereof will be readily obtained as the same becomes better understood by reference to the following detailed description when considered in connection with the following figures.

DESCRIPTION OF THE EMBODIMENTS

The present development is applicable to an audio mixer and a method of processing a sound signal.

First Embodiment

Figure 1:
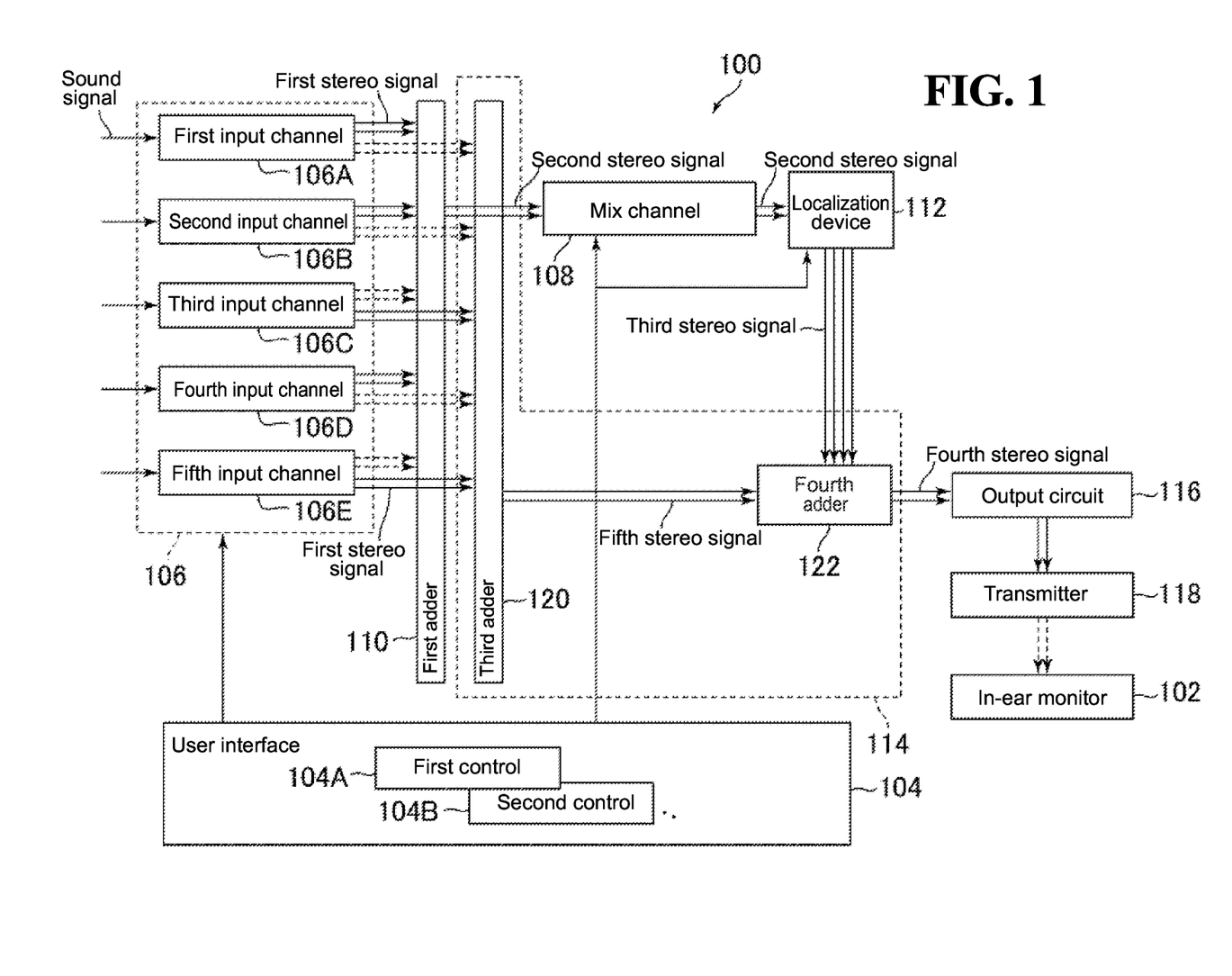
FIG. 1 is a block diagram of a monitoring system according to a first embodiment.

A first embodiment will be described by referring to the accompanying drawings. FIG. 1 is a block diagram of a monitoring system 100. The monitoring system 100 includes an audio mixer according to the first embodiment. As illustrated in FIG. 1, the monitoring system 100 includes the audio mixer and an in-ear monitor 102. The audio mixer includes a user interface 104, an input channel 106, a mix channel 108, a first adder 110, a localization device 112, a second adder 114, an output circuit 116, and a transmitter 118. A player may perform a monitoring using a headphone, instead of the in-ear monitor 102.

The user interface 104 receives, from an operator, a first parameter and a second parameter for each channel of a plurality of channels. The first parameter indicates a position in a right-left (lateral) direction, and the second parameter specifies at least one of internalization and externalization. This will be described in detail by referring to FIG. 2, which is a schematic representation of an operation panel illustrated as an example of the user interface 104 of the audio mixer.

The user interface 104 includes a plurality of channel strips 202. Each of the plurality of channel strips 202 corresponds to an input channel 106 and a mix channel 108. Each channel strip 202 includes a plurality of controls (also referred to as operation pieces). In the example illustrated in FIG. 2, each channel strip 202 includes a first control 104A, a second control 104B, and a third control 104C. Each of the controls is a key, a button, a rotary encoder, or a slider that accepts an operation made with respect to the audio mixer.

Figure 2:
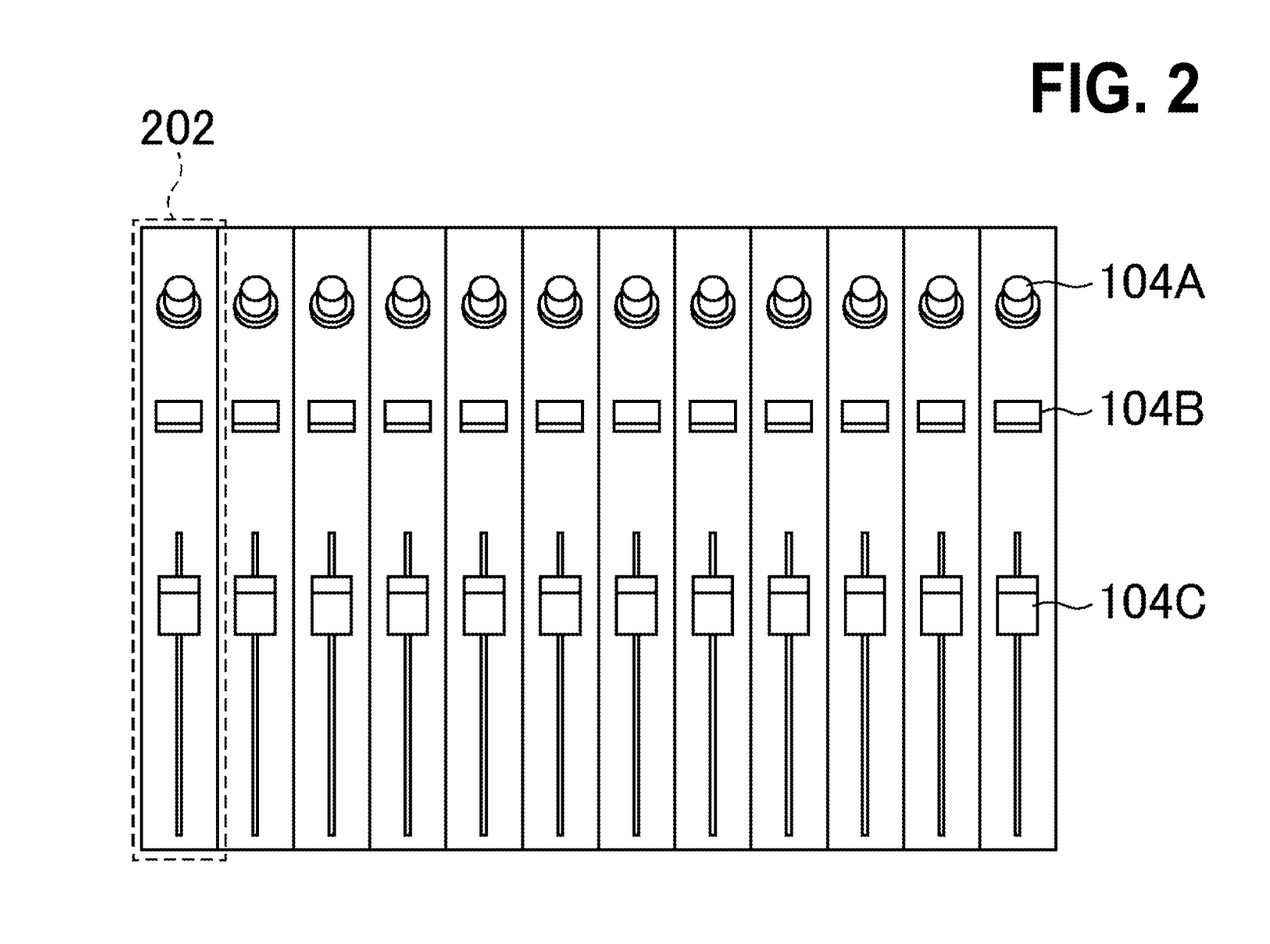
FIG. 2 is a schematic representation of an example operation panel.

The first control 104A receives, from the operator, a first parameter indicating a right-left (lateral) position for each channel. Examples of the first control 104A include a knob and a rotary encoder. The operator performs a rotation operation with respect to the first control 104A based on a desired localization position in the right-left direction. The first control 104A receives this rotation operation and supplies a first parameter corresponding to the angle of the knob or the rotary encoder.

The second control 104B receives a second parameter specifying at least one of internalization and externalization. An example of the second control 104B is a switch. The operator performs a switching operation with respect to the switch of each input channel 106 based on the desired localization, namely, internalization or externalization. The second control 104B receives this switching operation, and supplies, for each channel, a second parameter specifying where, the first adder 110 or the second adder 114, to input the first stereo signal. For example, in the example illustrated in FIG. 1, the second controls 104B corresponding to the first input channel 106A, the second input channel 106B, and the fourth input channel 106D supply a second parameter specifying externalization. Also in the example illustrated in FIG. 1, the second controls 104B corresponding to the third input channel 106C and the fifth input channel 106E supply a second parameter specifying internalization.

It is to be noted that the second parameter may specify, for each input channel 106, the level of balance between the first stereo signal input to the first adder 110 and the first stereo signal input to the second adder 114. For example, the second control 104B may be a knob, and the position indicated by a marker of the knob may correspond to the level of balance. Specifically, when the position indicated by the marker of the knob is middle position, the first stereo signal may be input to the first adder 110 and the second adder 114 at a ratio of 5:5. When the position indicated by the marker of the knob is at a position of 30% from the left, the first stereo signal may be input to the first adder 110 and the second adder 114 at a ratio of 3:7.

The third control 104C receives, from the operator, a third parameter indicating the volume of each channel. An example of the third control 104C is a slider. The operator performs a slide operation with respect to the slider based on a desired volume. The third control 104C receives this slide operation, and supplies a third parameter indicating the desired volume.

It is to be noted that the number of controls included in each channel strip 202 will not be limited to three; the number of controls may be two, or four or more insofar as at least the first control 104A and the second control 104B are included.

Figure 3:
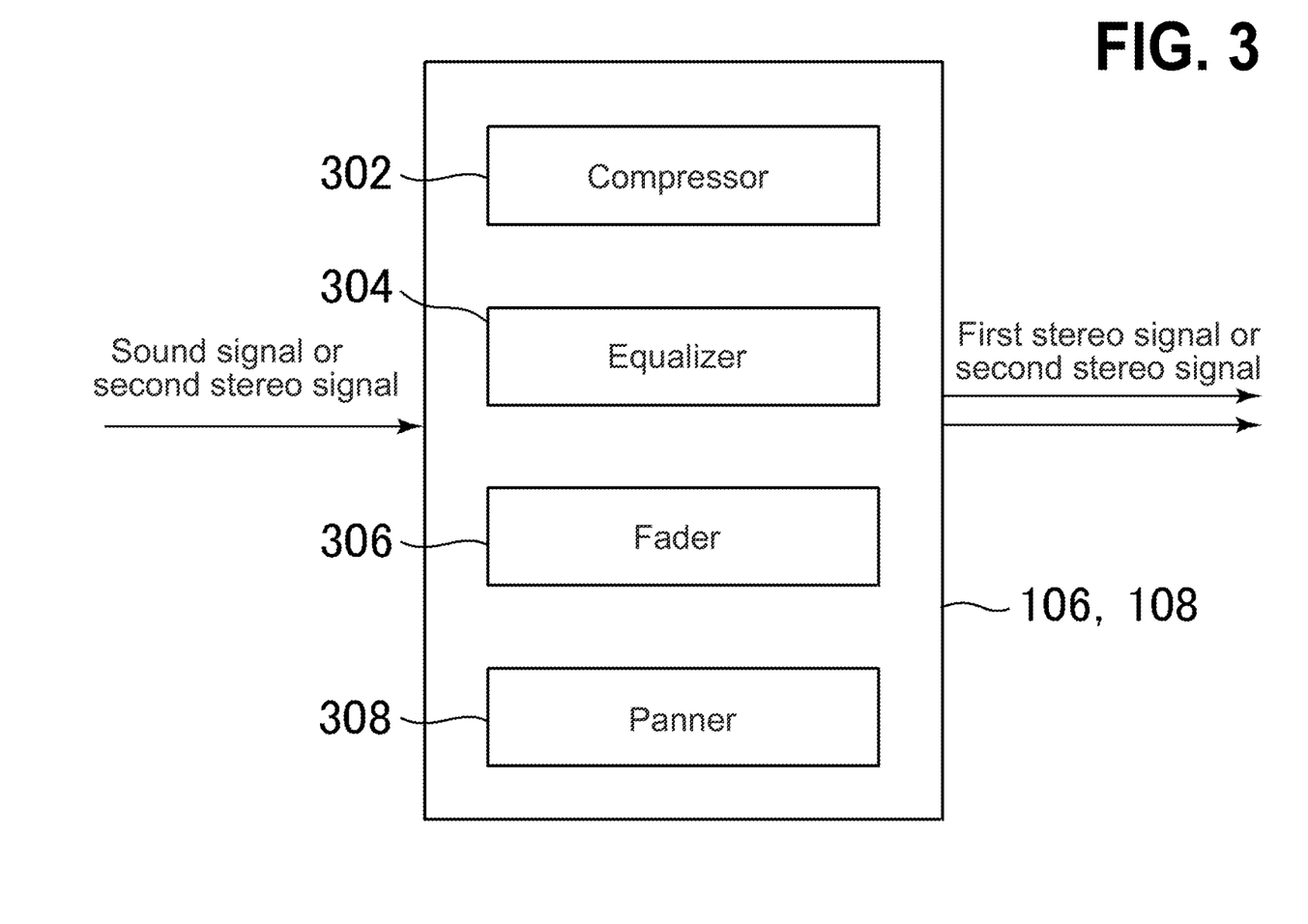
FIG. 3 is a functional block diagram of an input channel and a mix channel.

Each channel of the input channels 106 and the mix channels 108 performs various kinds of signal processing with respect to a monaural (mono) signal or a stereo signal that has been input to the each channel. Then, the each channel outputs the stereo signal that has been processed. The stereo signal is made up of a right-channel signal and a left-channel signal. Specifically, FIG. 3 is a functional block diagram of an input channel 106 and a mix channel 108. As illustrated in FIG. 3, each of the input channel 106 and the mix channel 108 includes a compressor 302, an equalizer 304, a fader 306, and a panner 308. It is to be noted that the mix channels 108 may be omitted.

Based on a threshold and a ratio specified by the operator, the compressor 302 performs dynamic level adjustment processing with respect to the input signal. The equalizer 304 amplifies and attenuates the signal processed by the compressor 302 in a frequency range specified by the operator. Based on the third parameter, the fader 306 performs volume adjustment processing with respect to the signal output from the equalizer 304. Based on the first parameter, the panner 308 performs panning processing with respect to the signal processed by the fader 306, thereby generating a first stereo signal.

In the first embodiment, a plurality of input channels 106 are provided. In response to a number of sound signals input to the plurality of input channels 106, the plurality of input channels 106 generate a plurality of first stereo signals. Each of the first stereo signals is input to a corresponding input channel 106, and output to the first adder 110 or the second adder 114 based on the second parameter output to the corresponding input channel 106.

For example, in the example illustrated in FIG. 1, the input channels 106 include five input channels 106, namely, a first input channel 106A, a second input channel 106B, a third input channel 106C, a fourth input channel 106D, and a fifth input channel 106E. For example, a sound signal transmitted from a kick, a snare, a bass, a guitar, or a microphone is input to each input channel 106. In the example illustrated in FIG. 1, the second controls 104B of the first input channel 106A, the second input channel 106B, and the fourth input channel 106D receive second parameters indicating externalization. With this configuration, the sound signals input to the first input channel 106A, the second input channel 106B, and the fourth input channel 106D are subjected to right-left localization based on the first parameters output to these input channels 106. Then, each sound signal is output to the first adder 110. In contrast, the second controls 104B of the third input channel 106C and the fifth input channel 106E receive second parameters indicating internalization. With this configuration, the sound signals input to the third input channel 106C and the fifth input channel 106E are subjected to right-left localization based on the first parameters output to these input channels 106. Then, each sound signal is output to the second adder 114.

The first adder 110 mixes first stereo signals corresponding to one or more channels, among the plurality of channels, in which the second parameters corresponding to the one or more channels specify externalization. By mixing the first stereo signals, the first adder 110 generates a single second stereo signal. The first adder 110 may be a bus such as a mixing bus, a stereo bus, and a matrix bus. With this configuration, the first adder 110 mixes signals input from the plurality of input channels 106. In this respect, a bus is a component of an audio mixer. This component receives a plurality of audio signals and outputs a result obtained by mixing the audio signals. When a bus has a stereo configuration, this bus mixes right-channel sound signals, independently of mixing of the left-channel sound signals, obtaining a single sound signal indicating a result obtained by mixing the right-channel sound signals. Also, the bus mixes left-channel sound signals, independently of mixing of the right-channel sound signals, obtaining a single sound signal indicating a result obtained by mixing the left-channel sound signals. Then, the bus outputs the obtained sound signals. In the example illustrated in FIG. 1, the first adder 110 mixes the first stereo signals output from the first input channel 106A, the second input channel 106B, and the fourth input channel 106D, and generates a single second stereo signal.

The second stereo signal is output to the mix channel 108. The mix channel 108 performs various kinds of signal processing with respect to the second stereo signal, and then outputs the processed second stereo signal to the localization device 112.

The localization device 112 performs three-dimensional localization with respect to the second stereo signal to generate two third stereo signals. Specifically, the localization device 112 performs three-dimensional localization with respect to each of the right-channel signal and the left-channel signal included in the second stereo signal, generating two third stereo signals. More specifically, the localization device 112 performs a convolution operation with respect to: a predetermined head related transfer function coefficient for the right-channel signal; and the right-channel signal included in the second stereo signal, thereby obtaining transfer characteristics of the sound arriving at both ears of the listener from an imaginary position of the right channel. In this manner, the localization device 112 generates a third stereo signal associated with the right channel. The localization device 112 performs similar processing with respect to the left-channel signal to generate a third stereo signal associated with the left channel. The generated two third stereo signals are output to a fourth adder 122, which is included in the second adder 114.

In this respect, by using head related transfer function coefficients that are prepared in advance, the three-dimensional localization can be performed without the operator performing an operation(s) that is(are) necessary to be performed in a complicated localization. It is also possible, however, for the operator to set various parameters associated with a three-dimensional localization so that the three-dimensional localization is adapted to the application in which the monitoring system 100 is used.

FIG. 1 illustrates an example in which the localization device 112 outputs, to the second adder 114, two third stereo signals (a total of four signals), namely, a third stereo signal that is associated with the right channel and that has been generated based on the right-channel signal; and a third stereo signal that is associated with the left channel and that has been generated based on the left-channel signal. In this respect, the third stereo signals associated with the right channel are to be added to each other at the second adder, described later, and the third stereo signals associated with the left channel are to be added to each other at the second adder. In light of this, the localization device 112 may: mix the right-channel signals of the generated two third stereo signals to obtain a stereo signal indicating the result of the mixing; and output the obtained stereo signal as a single third stereo mixed signal. Similarly, the localization device 112 may: mix the left-channel signals of the generated two third stereo signals to obtain a stereo signal indicating the result of the mixing; and output the obtained stereo signal as a single third stereo mixed signal. In this case, this mixing processing performed by the localization device 112 is regarded as a part (fifth adder 602) of the addition processing performed by a fourth adder (a part of the second adder), described later.

Specifically, the localization device 112 generates a single right-channel signal by mixing: the generated right-channel signal of the third stereo signal associated with the right channel; and the generated right-channel signal of the third stereo signal associated with the left channel. Similarly, the localization device 112 generates a single left-channel signal by mixing: the generated left-channel signal of the third stereo signal associated with the right channel; and the generated left-channel signal of the third stereo signal associated with the left channel. The localization device 112 outputs the single pair of stereo signals to the fourth adder 122 as a third stereo mixed signal (see FIG. 6).

The second adder 114 mixes the two third stereo signals with the first stereo signals corresponding to one or more channels, among the plurality of channels, in which the second parameters corresponding to the one or more channels specify internalization. In this manner, a fourth stereo signal is generated. Specifically, as illustrated in FIG. 1, the second adder 114 includes a third adder 120 and the fourth adder 122. The third adder 120 and the fourth adder 122 each may be a bus such as a mixing bus, a stereo bus, and a matrix bus, or may be a non-bus adder. The third adder 120 generates a single fifth stereo signal by mixing first stereo signals corresponding to one or more channels, among the plurality of channels, in which the second parameters corresponding to the one or more channels specify internalization. In the first embodiment, the third adder 120 generates a fifth stereo signal by mixing the first stereo signals output from the third input channel 106C and the fifth input channel 106E. The fourth adder 122 generates a single fourth stereo signal by mixing: the two third stereo signals obtained from the localization device 112; and the single fifth stereo signal obtained from the third adder 120. The second adder 114 outputs the generated fourth stereo signal to the output circuit 116.

It is to be noted that the first stereo signal and the two third stereo signals are preferably mixed at a predetermined ratio. For example, the fourth adder 122 mixes the third stereo signals and the fifth stereo signal at a mixing ratio of 1:1. By using a predetermined mixing ratio, the operator need not perform an operation(s) associated with the setting of the mixing ratio. It is to be noted that the mixing ratio will not be limited to 1:1; the mixing ratio may be any other mixing ratio or may be set suitably for the application in which the monitoring system 100 is used.

Figure 6:
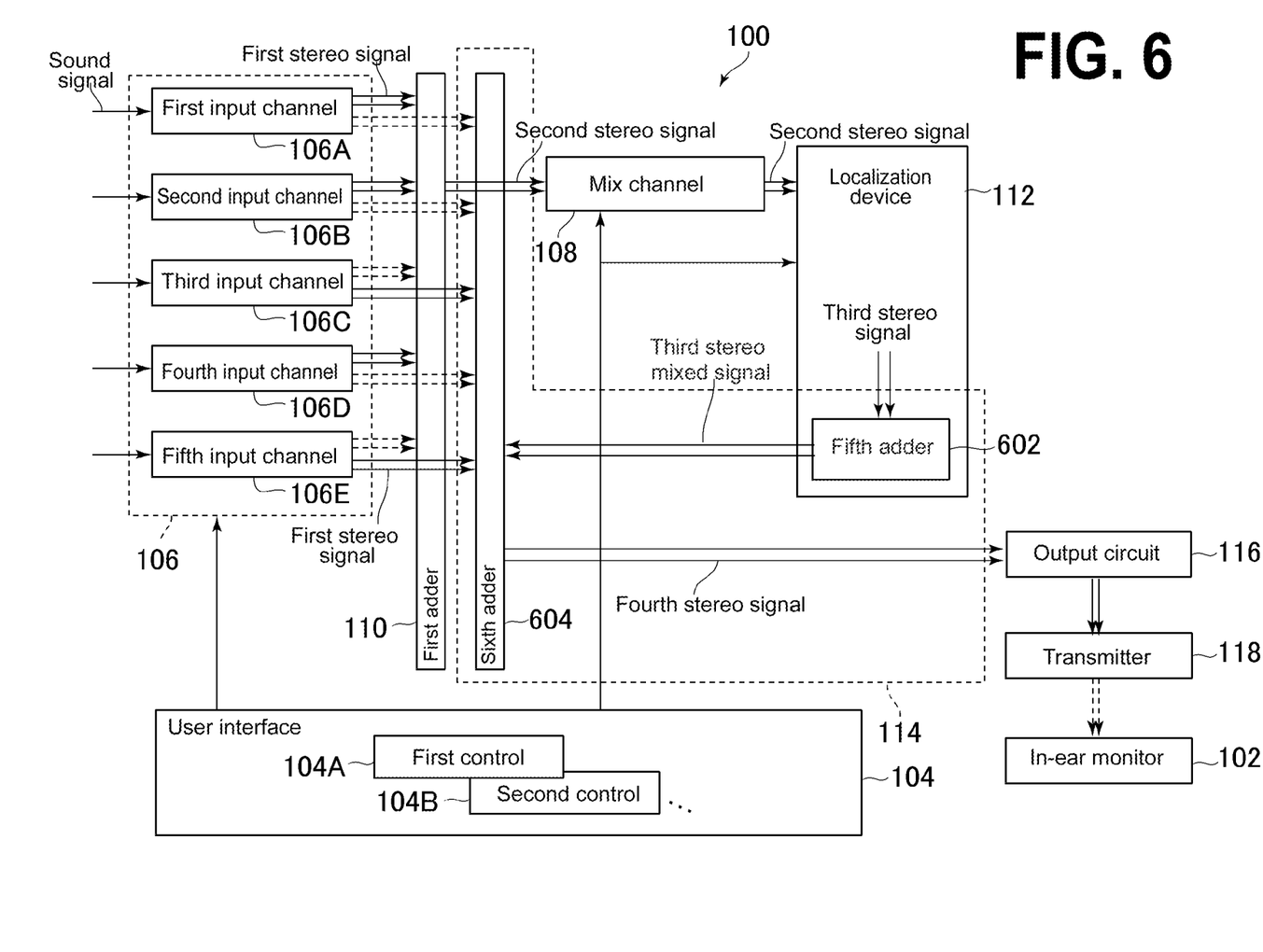
FIG. 6 is a block diagram of an audio mixer that includes a fifth adder and a sixth adder.

In the configuration in which the localization device 112 includes the fifth adder 602, the third stereo mixed signal is supplied from the localization device 112 to a sixth adder 604. In this case, the second adder 114 serves as the sixth adder 604. The sixth adder 604 generates a fourth stereo signal by mixing the third stereo mixed signal and first stereo signals corresponding to one or more channels, among the plurality of channels, in which the second parameters corresponding to the one or more channels specify internalization. The second adder 114 includes the sixth adder 604 and the fifth adder 602 of the localization device 112.

The output circuit 116 outputs the fourth stereo signal. Specifically, the output circuit 116 receives the fourth stereo signal output from the fourth adder 122. As necessary, the output circuit 116 subjects the fourth stereo signal to various kinds of signal processing such as level adjustment and frequency characteristic adjustment. Then, the output circuit 116 outputs the fourth stereo signal to the transmitter 118. The transmitter 118 receives the fourth stereo signal output from the output circuit 116, and wirelessly transmits the fourth stereo signal to the in-ear monitor 102. The in-ear monitor 102 includes a receiver that receives the fourth stereo signal transmitted from the transmitter 118. The in-ear monitor 102 emits sound based on the received fourth stereo signal. This configuration enables the performer (such as a vocalist) wearing the in-ear monitor 102 to hear sound in which sound signals input to some input channels 106 is externalized and acoustic signals input to the other input channels 106 are internalized.

It is to be noted that while FIG. 1 illustrates only a single transmitter 118 and only a single in-ear monitor 102, if there are a plurality of players, there will be provided the same number of transmitters 118 and the same number of in-ear monitors 102. It is also to be noted that if there is a speaker faced toward the audience seats on the site of a live performance, it is possible for the output circuit 116 to directly output a plurality of signals mixed for the audience seats.

If there are a large number of in-ear monitors, the first adder 110 and the second adder 114 may be provided for each output destination (for each in-ear monitor 102 or for each group of in-ear monitors) so that a fourth stereo signal varied depending on the output destination is generated. Specifically, based on a mode indicating an output destination selected by the operator, the user interface 104 may collectively switch various parameters controlled by the controls of the channel strip 202. Examples of selectable modes include guitar player mode, vocalist mode, and drum player mode.

For example, when the guitar player mode is selected, a fourth stereo signal generated through the first adder 110 and the second adder 114 that correspond to the guitar player mode is output to the in-ear monitor 102 of the guitar player. When the vocalist mode is selected, a fourth stereo signal generated through the first adder 110 and the second adder 114 that correspond to the vocalist mode is output to the in-ear monitor 102 of the vocalist.

The audio mixer described above may be implemented in the form of hardware, or may be implemented in the form of software on a personal computer. With the above-described audio mixer, the monitoring system 100 enables the operator to easily specify a localization position in three-dimensional space for each channel.

A method according to the first embodiment of processing a sound signal will be described. The following description is regarding a case where sound signals input from the first input channel 106A to the fifth input channel 106E are localized at the positions illustrated in FIG. 4.

Figure 4:
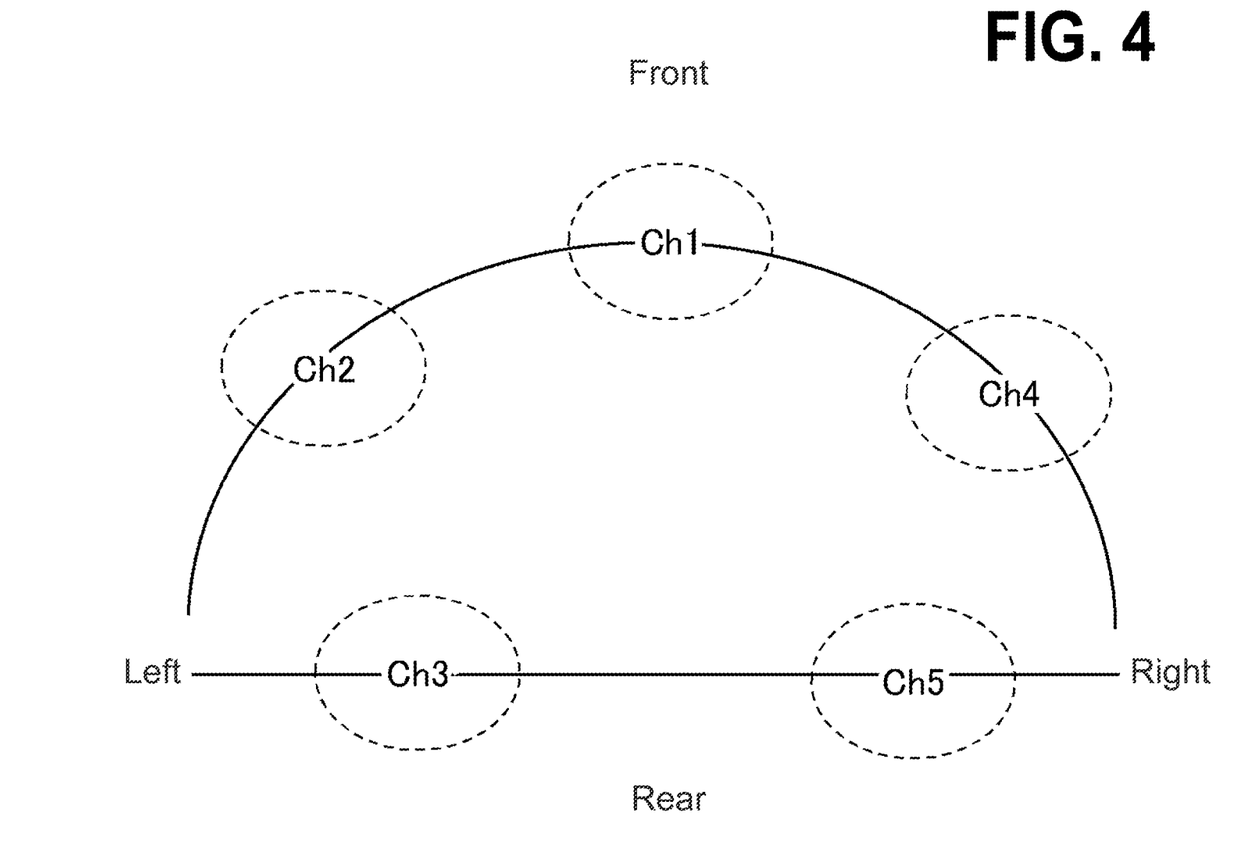
FIG. 4 is a schematic representation of a positional relationship between sound image localizations of channels.

First, the user interface 104 receives a first parameter and a second parameter. Specifically, the operator handles the first control 104A corresponding to the first input channel 106A such that the sound indicated by the sound signal input to the first input channel 106A is localized at a center position. The operator also handles the first controls 104A of the second input channel 106B and the third input channel 106C such that the sound signals input to the second input channel 106B and the third input channel 106C are localized at left positions. The operator also handles the first controls 104A of the fourth input channel 106D and the fifth input channel 106E such that the sound signals input to the fourth input channel 106D and the fifth input channel 106E are localized at right positions.

The operator also performs an operation of specifying externalization with respect to the second controls 104B of the first input channel 106A, the second input channel 106B, and the fourth input channel 106D. The operator also performs an operation of specifying internalization with respect to the second controls 104B of the third input channel 106C and the fifth input channel 106E. Upon the operator performing these operations, the user interface 104 supplies a first parameter and a second parameter for each input channel 106.

At each input channel 106, the input sound signal is subjected to panning based on the corresponding first parameter. In this manner, a first stereo signal is generated in each input channel 106. Then, the first stereo signals generated by the first input channel 106A, the second input channel 106B, and the fourth input channel 106D are output to the first adder 110. The first stereo signals generated by the third input channel 106C and the fifth input channel 106E are output to the second adder 114.

The first adder 110 mixes the first stereo signals output from the first input channel 106A, the second input channel 106B and the fourth input channel 106D to generate a single second stereo signal. The generated second stereo signal is output to the mix channel 108.

The third adder 120 mixes the first stereo signals output from the third input channel 106C and the fifth input channel 106E to generate a fifth stereo signal.

As necessary, the second stereo signal is subjected to various kinds of signal processing at the mix channel 108, and then is input to the localization device 112. The localization device 112 performs the above-described externalization with respect to the second stereo signal to generate two third stereo signals.

In this respect, the second stereo signal is a signal obtained by mixing the first stereo signals generated by the first input channel 106A, the second input channel 106B, and the fourth input channel 106D. Using such second stereo signal eliminates the need for specifying a localization position individually for each of the first input channel 106A, the second input channel 106B, and the fourth input channel 106D, reducing the labor of the operator.

The fourth adder 122 mixes the third stereo signals obtained from the localization device 112 with the fifth stereo signal obtained from the third adder 120 to generate a fourth stereo signal.

The output circuit 116 performs, as necessary, various kinds of signal processing with respect to the fourth stereo signal output from the fourth adder 122, and then outputs the fourth stereo signal to the transmitter 118. The transmitter 118 wirelessly transmits the fourth stereo signal to the in-ear monitor 102, and the player (vocalist) wearing the in-ear monitor 102 is able to hear sound in which sound signals of some input channels 106 are externalized and sound signals of the other input channels 106 are internalized.

The method according to the first embodiment of processing a sound signal finds applications in monitoring performed by musical players on stages. The method also finds applications in various other kinds of monitoring, such as: monitoring performed by karaoke singers in; and monitoring performed by participants in teleconference systems. The form of the audio mixer will not be limited to hardware dedicated to mixing; the audio mixer may be implemented in the form of an audio workstation (DAW) application operable on a computer or a cloud-deployed mixing instance.

According to the first embodiment, the operator is able to control a localization position in three-dimensional space using only two parameters, namely, a parameter indicating internalization or externalization and a parameter indicating a position in the right-left direction. By referring to the two parameters for each channel, the operator is able to easily grasp a localization position. Also in the first embodiment, it is not necessary to set an externalization position for each of the plurality of sound signals. Because of this unnecessity, the operator would find the above operation easy to perform even if the operator is a typical operator accustomed to a right-left localization control operation.

Second Embodiment

Figure 5:
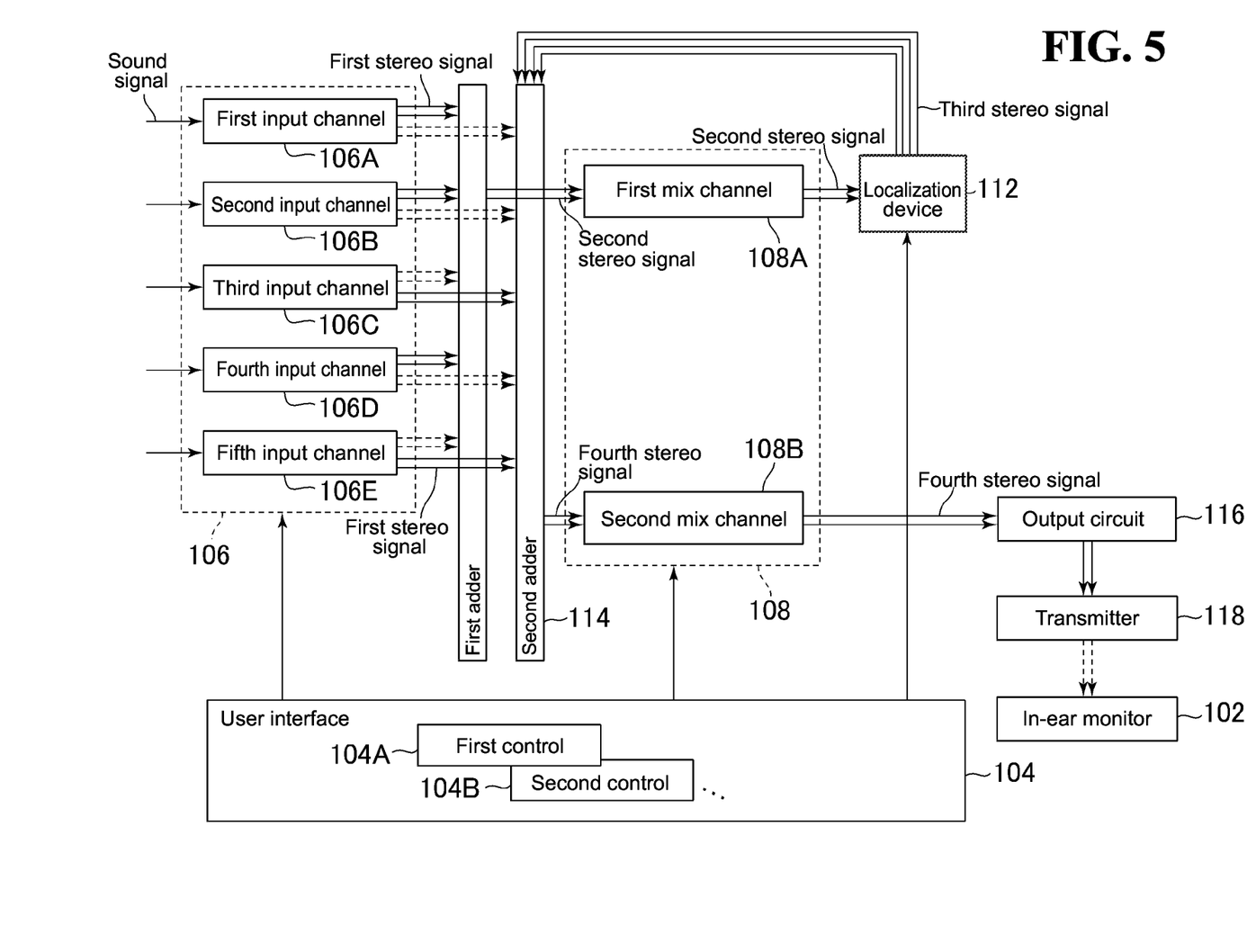
FIG. 5 is a block diagram of an audio mixer according to a second embodiment.

FIG. 5 is a block diagram of a monitoring system that includes an audio mixer according to a second embodiment. The following description will omit description of configurations similar or identical to configurations in the first embodiment. In the first embodiment, the second adder 114 includes the third adder 120 and the fourth adder 122. The second embodiment is different from the first embodiment in that the second adder 114 is a single adder (bus).

The second adder 114 generates a fourth stereo signal by mixing: first stereo signals corresponding to one or more channels in which the second parameters corresponding to the one or more channels specify internalization; and two third stereo signals obtained from the localization device 112. The second adder 114 transmits the generated fourth stereo signal to the second mix channel 108. Similarly to the mix channel 108 according to the first embodiment, a first mix channel 108A and a second mix channel 108B perform various kinds of signal processing with respect to input stereo signals. The second embodiment is similar to the first embodiment in that the sound signals input to some of the input channels 106 are subjected to externalization and mixed with the sound signals input to the other input channels 106 with no localization performed on the sound signals of the other input channels 106. Similarly to the first embodiment, the first mix channel 108A and the second mix channel 108B may be omitted.

Similarly to the first embodiment, the second adder 114 may be a bus such as a mixing bus, a stereo bus, and a matrix bus. In the first embodiment, two buses are necessary as the second adder 114. In the second embodiment, however, a single bus is used as the second adder 114. Thus, the number of buses used in an audio mixer is reduced.

In a configuration in which the localization device 112 illustrated in FIG. 5 includes the fifth adder 602, the above-described third stereo mixed signals are supplied from the localization device 112 to the sixth adder 604. In this case, the second adder 114 serves as the sixth adder 604. This sixth adder 604 generates a fourth stereo signal by mixing the third stereo mixed signals with first stereo signals corresponding to one or more channels, among the plurality of channels, in which the second parameters corresponding to the one or more channels specify internalization. The second adder 114 includes the sixth adder 604 and the fifth adder 602 of the localization device 112.

The present disclosure will not be limited to the above-described embodiments and are open to various modifications. The configuration of the audio mixer and the method of processing an audio signal have been provided for exemplary purposes only, not for limiting purposes. The configuration or the method may be replaced with a configuration or a method that provides substantially an identical effect(s) or that accomplishes substantially an identical object(s).

While embodiments of the present disclosure have been described, the embodiments are intended as illustrative only and are not intended to limit the scope of the present disclosure. It will be understood that the present disclosure can be embodied in other forms without departing from the scope of the present disclosure, and that other omissions, substitutions, additions, and/or alterations can be made to the embodiments. Thus, these embodiments and modifications thereof are intended to be encompassed by the scope of the present disclosure. The scope of the present disclosure accordingly is to be defined as set forth in the appended claims.

What is claimed is:

1. An audio mixer comprising:
   a user interface configured to receive a user operation and supply a first parameter and a second parameter for each channel of a plurality of channels included in the audio mixer based on the received user operation, the first parameter indicating a position in a right-left direction, the second parameter specifying either an internalization or an externalization;

a plurality of panners respectively corresponding to the plurality of channels and being configured to, based on the first parameter for the each channel of the plurality of channels, pan a sound signal corresponding to the each channel of the plurality of channels so as to generate a plurality of first stereo signals respectively corresponding to the plurality of channels;

a first adder configured to generate a second stereo signal by mixing one or more first stereo signals among the plurality of first stereo signals that respectively correspond to one or more externalization channels among the plurality of channels, the one or more externalization channels being channels in which the second parameter specifies the externalization;

a localization device configured to generate two third stereo signals by performing three-dimensional localization on the second stereo signal;

a second adder configured to generate a fourth stereo signal by mixing the two third stereo signals and one or more first stereo signals among the plurality of first stereo signals that respectively correspond to one or more internalization channels among the plurality of channels, the one or more internalization channels being channels in which the second parameter specifies the internalization; and an output circuit configured to output the fourth stereo signal.

2. The audio mixer according to claim 1, wherein the second adder comprises:
a third adder configured to generate a fifth stereo signal by mixing the one or more first stereo signals that respectively correspond to the one or more internalization channels, and
a fourth adder configured to generate the fourth stereo signal by mixing the two third stereo signals and the fifth stereo signal.

3. The audio mixer according to claim 2, wherein the second parameter specifies the first adder or the second adder as an input destination for each of the plurality of first stereo signals respectively corresponding to the plurality of channels.

4. The audio mixer according to claim 2, wherein the second parameter further specifies a balance level according to which each of the plurality of first stereo signals respectively corresponding to the plurality of channels is weighted and input to the first adder and the second adder.

5. The audio mixer according to claim 1, wherein the second parameter specifies the first adder or the second adder as an input destination for each of the plurality of first stereo signals respectively corresponding to the plurality of channels.

6. The audio mixer according to claim 5, wherein the second adder is configured to generate the fourth stereo signal by mixing the two third stereo signals and the one or more first stereo signals that respectively correspond to the one or more internalization channels according to a predetermined ratio.

7. The audio mixer according to claim 5,
wherein the second stereo signal comprises a right-channel signal and a left-channel signal, and
wherein the localization device is configured to generate the two third stereo signals by performing the three-dimensional localization on both of the right-channel signal and the left-channel signal.

8. The audio mixer according to claim 1, wherein the second adder is configured to generate the fourth stereo signal by mixing the two third stereo signals and the one or more first stereo signals that respectively correspond to the one or more internalization channels according to a predetermined ratio.

9. The audio mixer according to claim 1,
wherein the second stereo signal comprises a right-channel signal and a left-channel signal, and
wherein the localization device is configured to generate the two third stereo signals by performing the three-dimensional localization on both of the right-channel signal and the left-channel signal.

10. The audio mixer according to claim 9, wherein the second adder comprises:
a fifth adder configured to mix the two third stereo signals to generate a single third stereo mixed signal, and
a sixth adder configured to generate the fourth stereo signal by mixing the single third stereo mixed signal and the one or more first stereo signals that respectively correspond to the one or more internalization channels.

11. A method of processing a sound signal, the method comprising:
receiving a user operation and supplying a first parameter and a second parameter for each channel of a plurality of channels included in an audio mixer based on the received user operation, the first parameter indicating a position in a right-left direction, the second parameter specifying either an internalization or an externalization;
panning, based on the first parameter for the each channel of the plurality of channels, a sound signal corresponding to the each channel of the plurality of channels so as to generate a plurality of first stereo signals respectively corresponding to the plurality of channels;
generating a second stereo signal by mixing one or more first stereo signals among the plurality of first stereo signals that respectively correspond to one or more externalization channels among the plurality of channels, the one or more externalization channels being channels in which the second parameter specifies the externalization;
generating two third stereo signals by performing three-dimensional localization on the second stereo signal;
generating a fourth stereo signal by mixing the two third stereo signals and one or more first stereo signals among the plurality of first stereo signals that respectively correspond to one or more internalization channels among the plurality of channels, the one or more internalization channels being channels in which the second parameter specifies the internalization; and
outputting the fourth stereo signal.

* * * * *